(12) United States Patent
Stickel et al.

(10) Patent No.: US 6,420,713 B1
(45) Date of Patent: Jul. 16, 2002

(54) IMAGE POSITION AND LENS FIELD CONTROL IN ELECTRON BEAM SYSTEMS

(75) Inventors: Werner Stickel, Ridgefield, CT (US); Steven Douglas Golladay, Hopewell Junction, NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/301,000

(22) Filed: Apr. 28, 1999

(51) Int. Cl.[7] ............................................. H01J 37/141
(52) U.S. Cl. ............................ 250/396 ML; 250/396 R
(58) Field of Search .................... 250/396 R, 396 ML, 250/398

(56) References Cited

U.S. PATENT DOCUMENTS

| | | | |
|---|---|---|---|
| 4,804,851 A | * 2/1989 | Nixon | 250/398 |
| 4,847,502 A | * 7/1989 | Bradley et al. | 250/396 R |
| 4,859,856 A | 8/1989 | Groves et al. | 250/398 |
| 4,945,246 A | 7/1990 | Davis et al. | 250/492.2 |
| 5,075,662 A | * 12/1991 | Leupold et al. | 335/306 |
| 5,136,167 A | 8/1992 | Langner et al. | 250/396 R |
| 5,389,858 A | 2/1995 | Langner et al. | 315/370 |
| 5,473,221 A | 12/1995 | Do et al. | 315/8 |
| 5,481,164 A | 1/1996 | Langner et al. | 315/370 |
| 5,663,568 A | * 9/1997 | Waskiewicz | 250/398 |
| 5,703,375 A | * 12/1997 | Chen et al. | 250/492.21 |
| 5,708,274 A | 1/1998 | Langner et al. | 250/396 |
| 5,747,819 A | * 5/1998 | Nakasuji et al. | 250/398 |
| 5,757,010 A | 5/1998 | Langner | 250/396 ML |
| 5,793,048 A | 8/1998 | Petric et al. | 250/396 ML |

\* cited by examiner

*Primary Examiner*—Bruce Anderson
(74) *Attorney, Agent, or Firm*—Graham S. Jones, II

(57) ABSTRACT

A charged particle beam system with a source of charged particles produces a beam directed along a path. A given electromagnetic lens is located along the path. The given electromagnetic lens is adapted to produce a first field directed with a first orientation adapted for affecting a beam of charged particles directed along the path through the lens. A bucking electromagnetic lens is juxtaposed with the given electromagnetic lens adapted to produce a bucking field directed with a bucking orientation adapted for affecting the beam of charged particles directed along the path. The bucking field has an orientation opposing the first field. A fringe field from the bucking electromagnetic lens produces a nulling field to compensate for aberrations and/or beam disturbances.

24 Claims, 9 Drawing Sheets

|  |  | bucking lens position shift |  | combined field B[G] |  |
| --- | --- | --- | --- | --- | --- |
|  |  | dz[mm] | attenuation factor | in reticle plane |  |
|  |  | 10 | 0.0894 | 0.00 | -0.110 |
|  |  | 5 | 0.0952 | 0.00 | -0.101 |
|  | reticle plane | 0 | 0.1019 | 0.00 | -0.094 |
|  |  | -5 | 0.1095 | 0.00 | -0.088 |
|  |  | -10 | 0.1019 | 0.00 | -0.094 |
|  |  |  |  |  |  |
|  |  | 0 | 0.00 | 7.68 | -0.202 |

FIG. 8

IMAGE POSITION AND LENS FIELD CONTROL IN ELECTRON BEAM SYSTEMS

BACKGROUND OF THE INVENTION

1. Field of the Invention

This invention relates to electron beam particle systems and more particularly to an imaging section of a charged particle beam probe forming or projection system, such as an Electron Beam Projection System (EBPS).

2. Description of Related Art

Stray fields extending from lenses in close proximity to a charged particle beam column can cause aberrations or other disturbances; and an imbalance of fields at a critical portion of a column can distort the beam or its path greatly reducing the quality of performance of the system.

In electron beam (E/B) systems incorporating large area reduction projection optics, it is critical to minimize electron-optical performance detractors, such as aberrations and positional disturbances.

Accordingly there is a need for a way to compensate for those factors.

In some cases, use of a conventional lenses to compensate for these problems is not possible because of limitations of space in a column of electromagnetic lenses where space is at a premium.

Where a moving image plane is involved, the sum of all fields from one, two or three lenses should be zero. If not then the result will be aberrations and/or positional disturbances which as pointed out above are unsatisfactory.

SUMMARY OF THE INVENTION

An object of this invention is to provide a lens in a charged particle beam system which can null fields thereby providing compensation of unwanted fields to provide fields with a sum of zero field at the image plane.

Definition of "Doublet"

The term "doublet" as used herein denotes a pair of lenses operated under a specific symmetry condition, established in the following way:

A source (of particles) illuminates an object in front of a lens pair. The object is located precisely in the front focal plane of the first lens. The first lens generates an image of the source between the pair, and an image of the (closer) object at infinity. This effectively collimates the rays of particles emerging from the object. Accordingly the first lens is labeled "collimator". The second lens is positioned exactly such that its front focal plane coincides with the back focal plane of the first lens. The second lens focuses the collimated, therefore parallel rays at its back focal plane, which then becomes the image plane for the object. Since the object is now projected into the image plane, the second lens is refined to as "projector". Under this condition the optical magnification of the lens pair is given by the ratio of the focal lengths of projector to collimator, $M=f2/f1$. Simultaneously, the object—image distance, is given by $L=2(f1+f2)$. If lenses of the same shape are used, i.e. if they are by mathematical definition "similar", then their sizes scale with their respective focal lengths. For example, if $f1=4f2$, the collimator must be four times as large as the projector to maintain similarity of the lenses, Consequently, the point of coincidence on the axis of focal points between the lenses, located at a distance from the object of $z1=2f1$, and of $z2=2f2$ from the image, constitutes a point of symmetry. The doublet is often referred to as "symmetric" about the point of coincidence on the system axis. In the special case of $f1=f2$ or unity magnification, the term often used is "mirror-symmetric", even though in the strict mathematical sense the doublet is "point symmetric".

If the source is placed infinitely far upstream of the doublet, its image will appear at the coincidence or symmetry plane. As a consequence, all rays originating from any point on the source or its intermediate image at the symmetry plane will be parallelized by the projector. The doublet then is characterized as a "telecentric symmetric doublet". If the lenses are of the magnetic type, their field polarities are generally chosen to be opposite to each other as to completely cancel the image rotation caused by each individual lens. One then speaks of an "antisymmetric doublet".

The reason for operating the lenses in the described way as a doublet is that several aberrations are eliminated (as one lens compensates the aberrations of the other lens in exactly the right ratio) and consequently image blur is reduced.

Definition of "Fine-tuning"

In the context of the present invention "fine-tuning" means as follows:

1(a) positioning of an (intermediate) image plane at exactly the right (axial) location, usually, where an aperture is mounted, for the purpose of maximum beam current transmission, or where a special optical plane is located such as the "symmetry plane" of the aforementioned doublet;

1(b) nulling/bucking of the field fringes of the lenses constituting the doublet, either to control/eliminate interference of the fields of lenses adjacent to the doublet under consideration, or to minimize the axial field strength as well as the gradient at an object or image plane, to minimize the lateral motion of the (deflected) beam in response to axial shifts of any such plane; in other words, to provide optimum "telecentricity, of the lens system. With this purpose in mind, such auxiliary lenses are often referred to as "bucking" lenses.

In accordance with this invention a system, apparatus and a method are provided wherein a charged particle beam system includes a source of charged particles producing a beam directed along a path including a given electromagnetic lens located along the path. The given electromagnetic lens is adapted to produce a first field directed with a first orientation adapted for affecting a beam of charged particles directed along the path through the lens. A bucking electromagnetic lens is juxtaposed with the given electromagnetic lens adapted to produce a bucking field directed with a bucking orientation adapted for affecting the beam of charged particles directed along the path, opposing the field of the given electromagnetic lens. A fringe field from the bucking electromagnetic lens produces a nulling field to minimize aberrations and disturbance of the particle beam due to target stage motion. Such disturbance can be caused by as follows:

a) eddy currents generated in metallic components in a stage moving through the magnetic field of the lens;

b) axial displacement of the image plane and consequently lateral shift of the beam landing position, c) magnetization of magnetic inclusions of the target of substrate.

Further in accordance with this invention a first shroud is formed surrounding the given electromagnetic lens having a pair of pole pieces with the shortest distance between the pole pieces being along a direction parallel to the path. A bucking shroud surrounds the bucking electromagnetic lens having a pair of bucking pole pieces with the shortest distance between the bucking pole pieces being along a direction transverse to the path. The bucking shroud is located adjacent to the first shroud.

A further electromagnetic lens is located along the path. The further electromagnetic lens is adapted to produce a further field directed with the first orientation adapted for affecting the beam of charged particles directed along the path through the lens. The further electromagnetic lens and the given electromagnetic lens are aligned along the axis with the given electromagnetic lens following the further electromagnetic lens along the path from the source of charged particles. The further electromagnetic lens is preferably located along the axis between the auxiliary lens and the given electromagnetic lens.

Preferably, an auxiliary lens is located along the path between the source and the given electromagnetic lens with an aperture located within the auxiliary lens.

Preferably, the auxiliary lens is located at an object plane and the bucking lens is located before a following image plane.

Preferably, the lenses and the electromagnetic coils are toroidal in configuration.

Preferably, It is also a preferred alternative that the system comprises an electron beam projection system.

BRIEF DESCRIPTION OF THE DRAWINGS

The foregoing and other aspects and advantages of this invention are explained and described below with reference to the accompanying drawings, in which:

FIG. 8 provides numerical data including the results of axially repositioning of the bucking lens, while its strength (its attenuation of the main field) of the adjacent main lens is adjusted to null the field at the target plane.

DESCRIPTION OF THE PREFERRED EMBODIMENT

Figure 1:
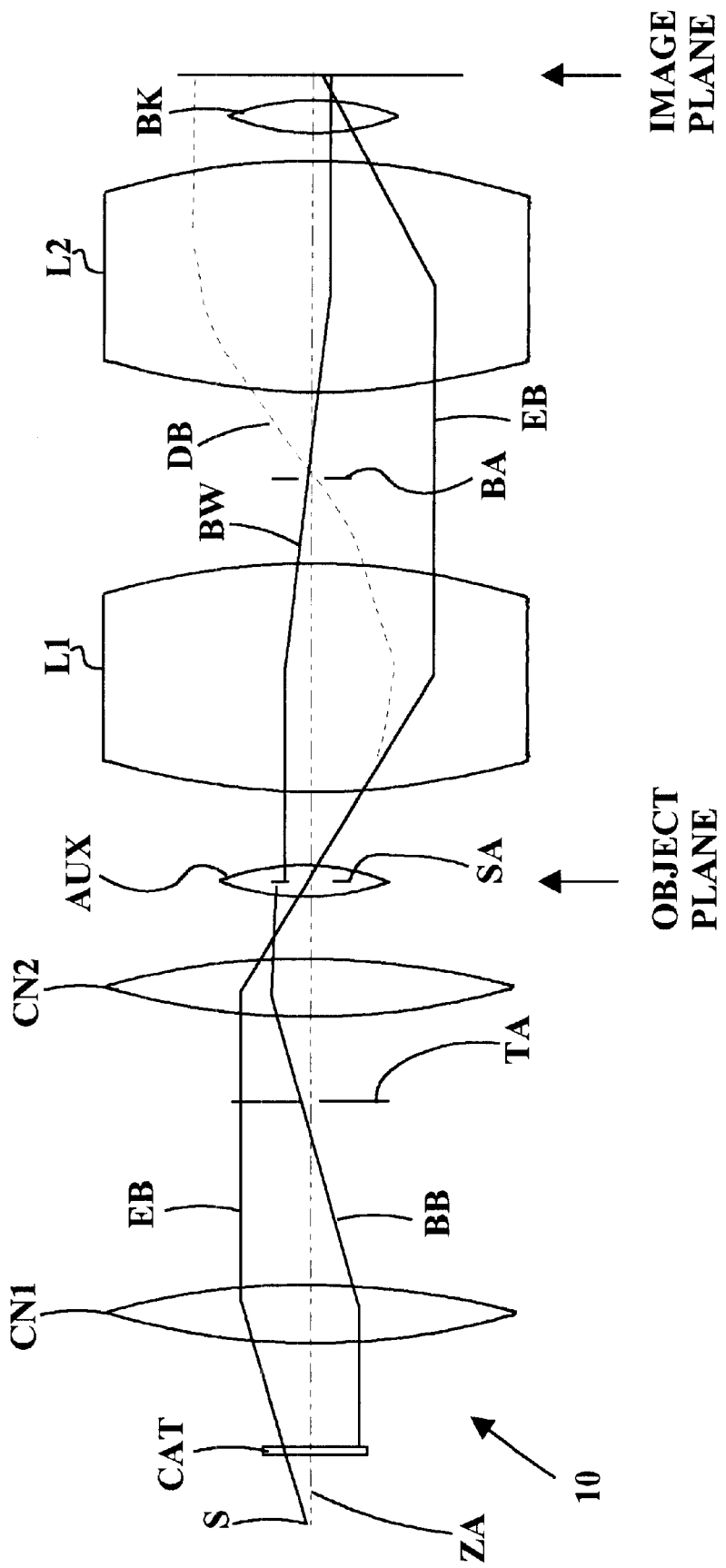
FIG. 1 shows a schematic diagram of an Electron Beam Projection System (EBPS) in accordance with this invention.

Referring to FIG. 1 an illumination section of an EBPS is shown to illustrate one of many contexts in which this invention can be employed to minimize or eliminate the detrimental effects of the target stage motion in the image plane and aberrations in a charged particle beam column. Some basic elements of an EBPS of the kind shown FIG. 1 are described in two copending patent applications of Werner Stickel and Steven Golladay Ser. No. 09/138,595 now U.S. Pat. No. 6,000,250 for "Illumination Deflection System for E-Beam Projection", and Ser. No. 09/138,592, now U.S. Pat. No. 6,023,067, filed Aug. 22, 1998 of Werner Stickel & Steven Golladay for "Blanking System for Electron Beam Projection System." In these applications, an auxiliary lens AUX is provided primarily, but not exclusively for the purpose of allowing for discrepancies between theoretical design and practical implementation of this section by providing the extra degree of freedom to perform the functions as follows:

2(a) position the image, in this case, of the beam source at exactly the plane of the aperture BA. This is critical, as in the given configuration, the beam EB passes aperture BA unobstructedly only under that condition, as explained in U.S. Pat. No. 6,023,067; placing the auxiliary lens AUX at the object such that its principle plane coincides with the object plane minimizing its effect on the size of the image at the image plane (target or reticle) in FIG. 1;

2(b) fine-adjust the image rotation generated in the case magnetic lenses are used in the doublet, such that the image of the object, in this case a square aperture denoted by SA in FIG. 1, has the proper orientation, eliminating the need of an aperture rotation mechanism, which would greatly complicate the design, as this aperture has to be positionally stable under a high heat load generated by the impinging beam.

Although not essential, the preferred embodiment of the auxiliary lens AUX of this invention is in a configuration, which allows the above adjustments, while providing compensation of the field of doublet lens L1 at the object SA to be commensurate, i.e. scaled by the doublet magnification factor to the level corresponding to the combined field of lens L2 and bucking lens BK at the image plane IP (target or reticle), in a preferred case to essentially eliminate any lens field at the aperture SA at any lens field (object plane) altogether.

In summary, referring to the Definition of "FINING TUNING" found above, auxiliary lens AUX primarily addresses above item 1(a), secondarily item 1(b). Another lens denoted as a bucking lens BK in FIG. 1 addresses items 1(a) and 1(b) in reverse order.

In accordance with this invention an auxiliary lens AUX and a bucking lens can be employed in combination with any charged particle lens system for fine-tuning purposes.

An "illuminator doublet", as shown in FIG. 1, is employed to illustrate the principles and purposes of providing both an "AUXiliary" lens AUX and a "BucKing" lens BK in a Charged Particle Beam System (CBPS).

Figure 2:
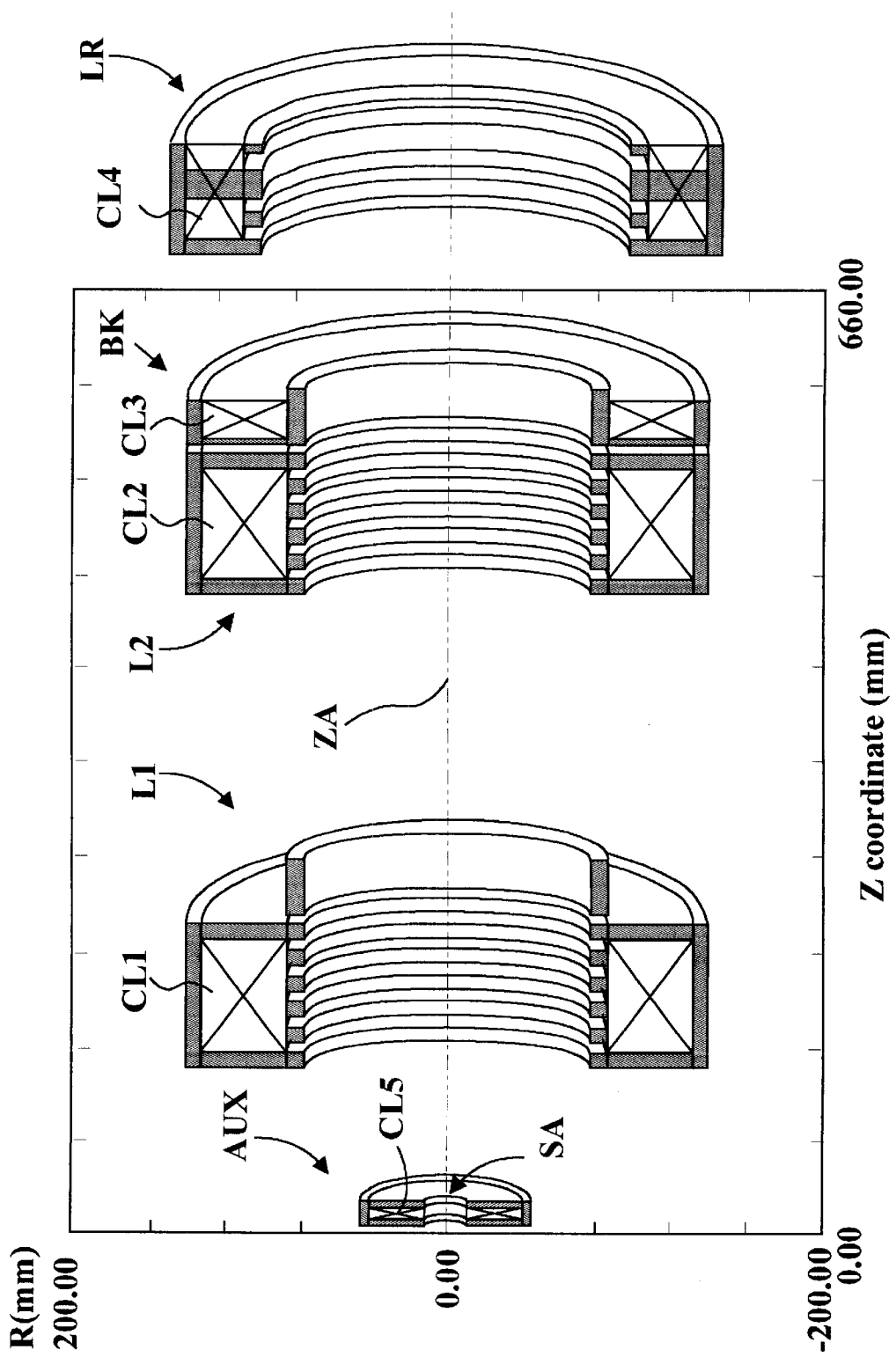
FIG. 2 is a schematic diagram showing a cross-sectional, perspective view of a preferred embodiment of this invention as embodied in the system of FIG. 1.

One key approach to provide the required performance with minimal aberrations is the employment of lens combinations generally referred to as a (ideal and/or symmetric) doublet as described in U.S. patent application Ser. No. 09/138,592, of Werner Stickel & Steven Golladay filed Aug. 22, 1998, now U.S. Pat. No. 6,023,067 for "Blanking System for Electron Beam Projection System" the teachings of which are incorporated herein by reference; and the teachings thereof are illustrated by FIGS. 1 and 2 therein with the exception of the bucking lens BK. Among many parameters to be carefully balanced to optimize performance are two best controlled by additional lenses, referred to as auxiliary, since their purpose is to support the main-lens action with added fine-tuning capability.

FIG. 1 shows a schematic diagram of the optics of the illumination section of an Electron Beam Projection System (EBPS) 10 such as described by H.C. Pfeiffer and W. Stickel in Microelectronics Engineering 27 (1995) 143. The purpose of such an illumination section is to provide appropriately distributed and positioned (electron) radiation energy to the object of the subsequent projection section, which generates a (reduced) image of this object at its target plane. The object contains an (enlarged) replica of the integrated circuit pattern, a image plane (target or reticle), to be reproduced in the radiation-sensitive material covering the substrate, e.g. a semiconductor wafer, in the target plane.

In FIG. 1, the lines ZA, EB and BB/BW symbolically represent, respectively, the central or symmetry Z-axis ZA of the section, the central imaging ray EB of the (virtual) source S, and the central imaging ray BB/BW of the so-called "cross-over", where all rays originating from the extended surface of the electron emitter or cathode CAT merge for the first time. The electromagnetic lenses CN1 and CN2 as well as the electromagnetic lenses L1 and L2 are arranged and operated in an optical configuration called an "anti-symmetric doublet", each having a symmetry plane, at which the trim aperture TA and blanking aperture BA, respectively, are placed. The auxiliary lens AUX provides an additional degree of freedom to assure proper placement of the cross-over image at blanking aperture BA. Further description of FIG. 1 is found below after the description of FIGS. 2–8.

Referring again to FIG. 1, trim aperture TA serves to trim or truncate the outer fringes of the intensity distribution in the cross-over, which is in general non-uniform (approximately Gaussian), such that the combined image of trim aperture TA and its truncated intensity distribution matches or is slightly smaller than the size of the opening in the diaphragm denoted as blanking aperture BA. The ray BW is in actuality the continuation of central imaging ray BB. This discontinuity, between ray BB and ray BW shown at the shaping aperture SA, indicates that the beam is "shaped" into the proper form required at the image plane (target or reticle), e.g. a square. For that purpose the beam which includes ray BB "overfills" the shaping aperture SA to ensure a uniform intensity profile across the opening in the diaphragm of the shaping aperture SA and ultimately across its image at the image plane (target or reticle), which illuminates an equally shaped "subfield" in the image plane (target or reticle). Finally, the ray DB represents the shaping aperture imaging ray EB, when it is deflected to illuminate an off-axis subfield in the image plane (target or reticle). The condition for ray (beam) DB is to cross the system Z-axis ZA and pass through blanking aperture BA under any deflected condition.

FIG. 2 is a schematic diagram showing a cross-sectional, perspective view of a preferred embodiment of this invention as embodied in the system of FIG. 1. The annular auxiliary lens AUX with its annular coil CL5 and the concentric, central aperture SA therethrough is followed by the electromagnetic lens L1 which includes a coil CL1 and magnetic circuits shown in their toroidal forms which are described in further detail in FIG. 3. Farther down the Z-axis ZA is the lens L2 with a coil CL2 and the magnetic circuit elements shown in their toroidal forms. Next, juxtaposed with lens L2 is the bucking lens BK with a coil CL3 projecting a magnetic field along the Z-axis ZA. A lens LR with a coil CL4 is shown farther down the Z-axis ZA. The dimensions of the structure radially and along the Z-axis ZA are shown for this embodiment.

Figure 3:
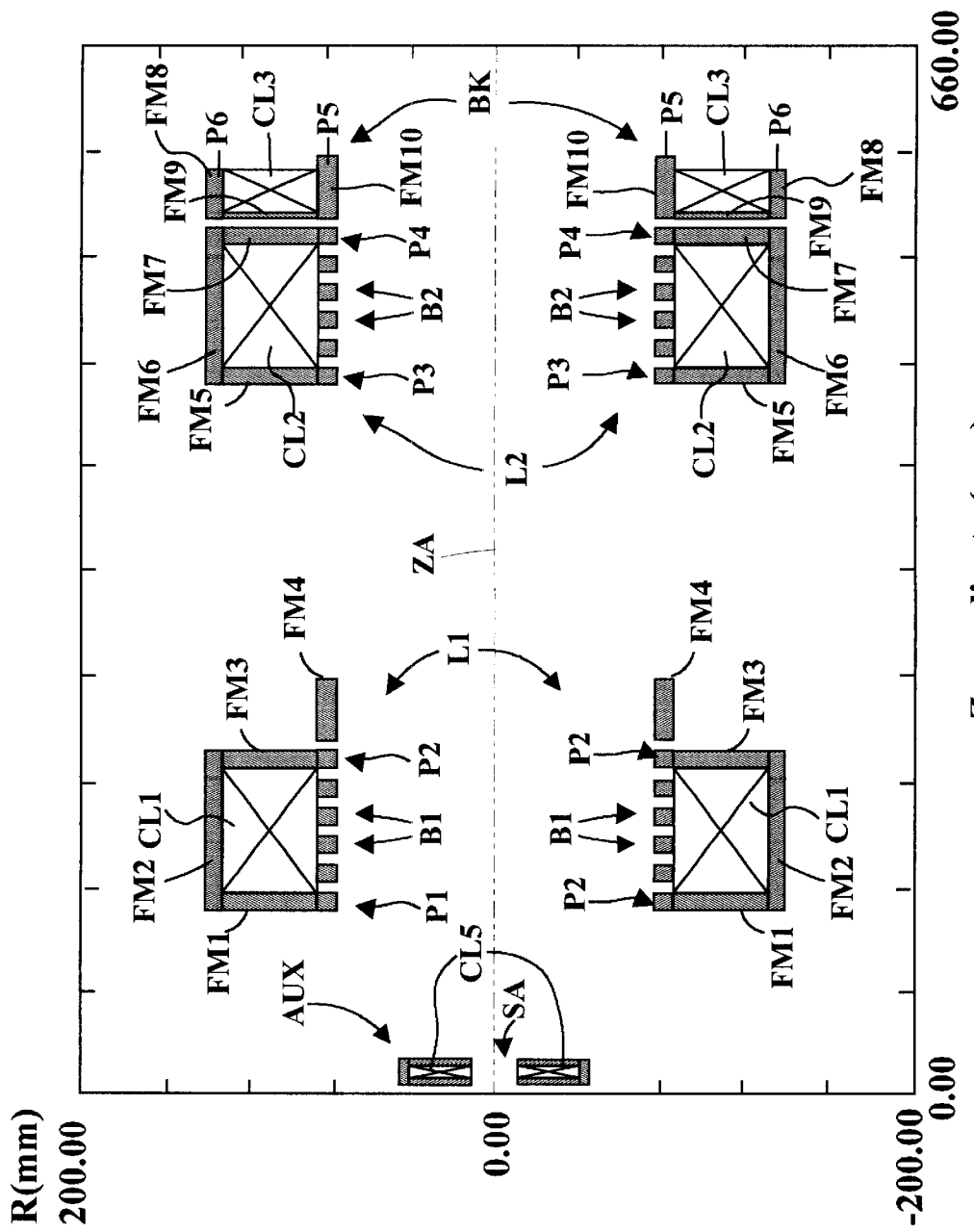
FIG. 3 is a schematic diagram showing a cross-sectional view of the embodiment of FIG. 2.

FIG. 3 is a schematic diagram showing a cross-sectional view of the embodiment of FIG. 2. FIG. 3 shows a "physical" configuration in a meridional plane, i.e. a plane containing the system Z-axis ZA. Everything is rotationally symmetric around the Z-axis ZA. Therefore, as illustrated in FIG. 2, the three-dimensional configuration of the device, all of the rectangular shapes represent toroidal structures.

Auxiliary lens AUX is located at the object plane as shown in FIG. 1 with the shape aperture located concentrically within the winding CL5 of the auxiliary lens AUX. Winding CL5 is housed within ferromagnetic elements with a magnetic gap at the periphery of the shaping aperture SA.

Figure 4:
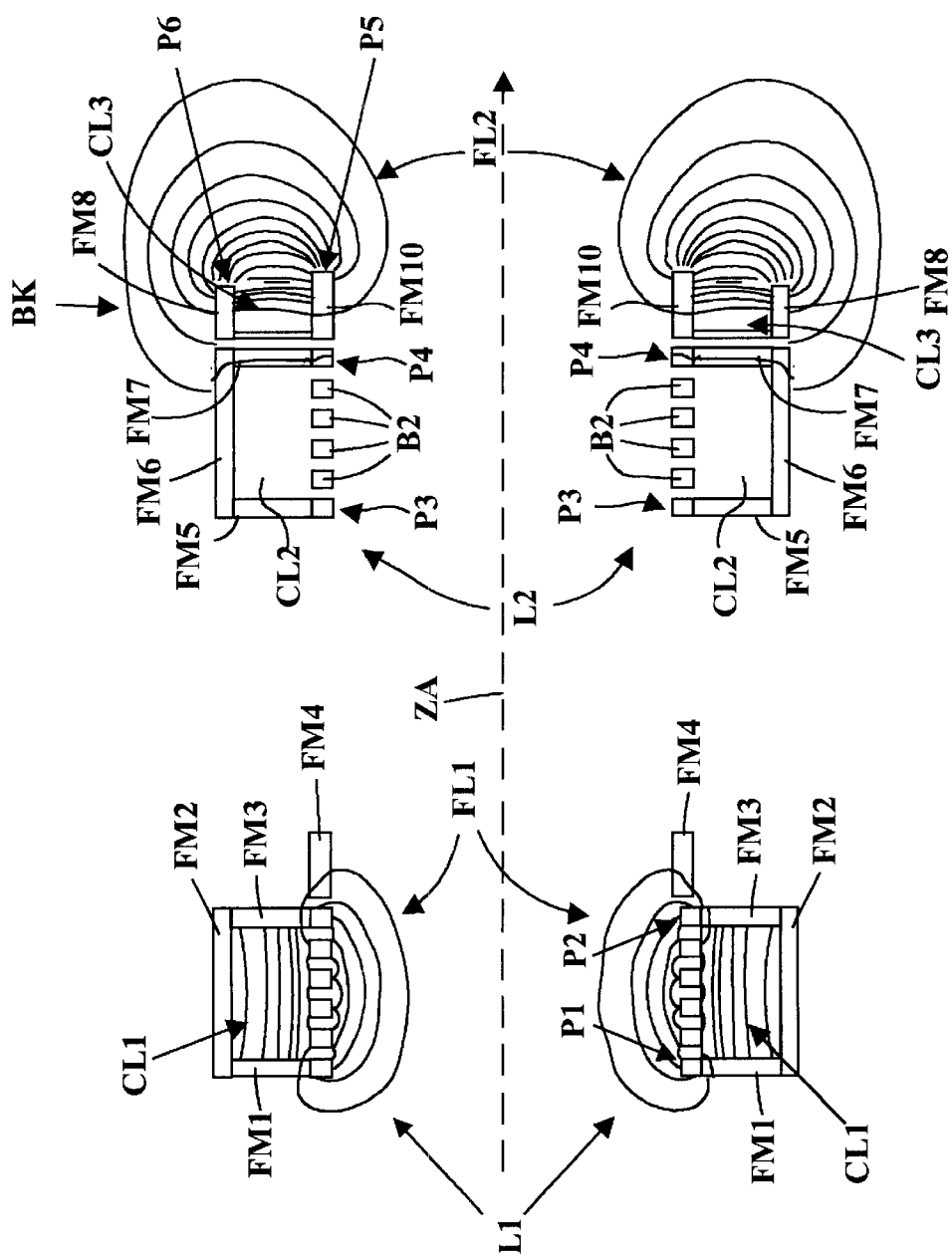
FIG. 4 shows the magnetic field lines for some coils and the magnetic shrouds formed thereabout from FIG. 3.

A doublet lens L1 is the next element found farther down the Z-axis ZA of portion of the beam system of FIG. 3. Electromagnetic lens L1 includes a toroidal, electromagnetic excitation coil CL1 coaxial with the Z-axis ZA. Lens L1 is surrounded by a shroud formed of flat disk shaped magnetic plates FM1 (to the left) and FM3 (to the right farther down the axis ZA) on the sides of coil CL1 and annular outer plate FM2 on the periphery of the coil CL1. There are pole pieces P1 and P2 at the inner ends of shroud end plates FM1 and FM3. The matching set of shroud plates FM1, FM2 and FM3 fit together to form a shroud confining the magnetic field from excitation coil CL1 to project a magnetic field from pole piece P1 down towards the Z-axis ZA across parallel to axis ZA and back up to pole piece P2, or the reverse. Between pole pieces P1 and P2 are located a set of parallel ferrite pole piece rings B1 which are separated by non-magnetic spacers as described in copending U.S. Pat. No. 6,000,250. The Pole piece rings B1 are coaxial with the Z-axis ZA and are formed on the inner surface of the coil CL1. The purpose of the rings B1 is to prevent the magnetic field from the coil CL1 from directly reaching the beam passing along the charged particle beam column. FIG. 4 shows the magnetic field lines FL1 for coil CL1 and the shroud formed thereabout. It is noted that the shortest distance between the poles P1 and P2 is parallel to the Z-axis ZA. In addition, the field between poles P1 and P2 is essentially parallel to the Z-axis ZA, except close to the vicinity of the pole pieces P1 and P2. An additional ferromagnetic ring FM4 is located adjacent to the pole piece P2 providing a degree of symmetry with the structure of the lens L2 and a portion of bucking lens BK.

A second doublet electromagnetic lens L2 is the next element found farther down the Z-axis ZA of portion of the beam system of FIG. 3. Lens L2 also includes a toroidal, electromagnetic excitation coil CL2 coaxial with the Z-axis ZA. Lens L2 is surrounded by an identical shroud formed of flat disk shaped magnetic plates FM5 (to the left) and FM7 (to the right farther down the axis ZA) on the sides of coil CL2 and annular outer plate FM6 on the periphery of the coil CL2. There are pole pieces P3 and P4 at the inner ends of shroud end plates FM5 and FM7. The matching set of shroud plates FM5, FM6 and FM7 fit together to form a shroud confining the magnetic field from excitation coil CL2 to project a magnetic field from pole piece P3 down towards the Z-axis ZA across parallel to Z-axis ZA and back up to pole piece P4, or the reverse. A set of ferrite pole piece rings B2 is located between pole pieces P3 and P4. Ferrite pole piece rings B2 are separated by non-magnetic spacers as described above with respect to rings B1. The pole piece rings B2 are coaxial with the Z-axis ZA and are formed on the inner surface of the coil CL2. The purpose of the rings B2 is to prevent the magnetic field from the coil CL2 from directly reaching the beam passing along the charged particle beam column. It is noted that the shortest distance between the poles P3 and P4 is parallel to the Z-axis ZA. In addition, the field between poles P3 and P4 is oriented essentially parallel to the Z-axis ZA, except close to the vicinity of the pole pieces P3 and P4.

The bucking electromagnetic lens BK is the next element found farther down the Z-axis ZA of portion of the beam system of FIG. 3. Bucking lens BK also includes an toroidal, electromagnetic excitation coil CL3 coaxial with the Z-axis ZA, but it is thinner along the Z-axis. Bucking lens BK is surrounded by another kind of shroud formed of elements FM8, FM9 and FM10. On the left of coil CL3 is a thin flat disk shaped magnetic plate FM9 covering the left surface of the coil CL3. An annular outer plate FM8 which is coaxial with Z-axis ZA, lies proximate to and covers the outer surface of coil CL3. An annular inner plate FM10 is proximate to and covers the inner surface of the coil CL3. There are pole pieces P5 and P6 at the right ends of shroud end plates FM8 and FM10. Matching shroud plates FM8, FM9 and FM10 fit together to form a shroud confining the magnetic field from excitation coil CL3 to project a magnetic field from pole piece P5 parallel to the Z-axis ZA up away from the Z-axis ZA and back to pole piece P6. As seen in FIG. 4, there are magnetic field lines FL2 for coil CL3 and the shroud with field lines formed thereabout which extend generally to the right in FIG. 4 of the bucking lens BK. It is noted that the shortest distance between the poles P5 and P6 is perpendicular to the Z-axis ZA. In addition, the field between poles P5 and P6 is oriented essentially perpendicular to the Z-axis ZA but parallel to Z-axis ZA in close vicinity of the pole pieces P5 and P6 and opposed to the field between the poles P3 and P4.

As will be well understood by those skilled in the art, the electromagnetic coils CL1, CL2, CL3, CL4 and CL5 are all connected by electrical wiring to sources of electrical power which are adjusted in amplitude and reversible in the direction of electrical current through those coils to energize electromagnetic coils CL1, CL2, CL3, CL4 and CL5 with the magnetic field strength and magnetic field direction required to provide magnetic field lines as required to have the desired effect upon an energy beam directed generally along the Z-axis ZA.

In addition to the auxiliary lens AUX, lens L1, lens L2, and bucking lenses BK, the lens LR (on the right) represents a lens beyond the image plane of the portion of the system which is of interest in connection with the present invention. In a complete projection system, if the lens system depicted in FIG. 3 were to function as an illuminator, then a lens such as lens LR would be present. The image plane then (and only then) is identical to the plane of a "reticle" as shown in FIG. 1 of copending U.S. patent application Ser. No. 09/138,592 of Stickel et al.

The reason to include the extra lens LR in FIG. 2 is to show the effect of the presence of another lens field overlapping the "L2" field, the superposition of which would have to be "bucked" by bucking lens BK.

FIG. 4 illustrates the lens field distributions of the typical doublet lenses L1 and L2 and the special configuration of the bucking lens BK, which is designed to provide the desired bucking effect, but which, of course, can be somewhat modified to improve on that.

It is important that the "pole-pieces", i.e. the end surfaces of the magnetic circuitry defining the "north"-pole and the "south"-pole of the magnet which the bucking lens BK represents, are not separated parallel to the Z-axis ZA as in a "normal" lens, but are separated in the radial direction at right angles to the Z-axis ZA. This is significant, because it is believed that a normal lens would not perform the task of bucking adequately (see the description of FIG. 6 and FIG. 7 found below).

Note that the fields of both lens L2 and bucking lens BK are determined with pieces of the respective other lens L2, since the field of each lens is influenced by the magnetic material of the other lens which is located in close proximity, as can be seen by the course of the field lines FL2. For symmetry, lens L1 is configured like lens L2, i.e. lens L1 includes ferromagnetic ring FM4 as lens L2 includes ferromagnetic ring FM10 proximate thereto.

Figure 5A:
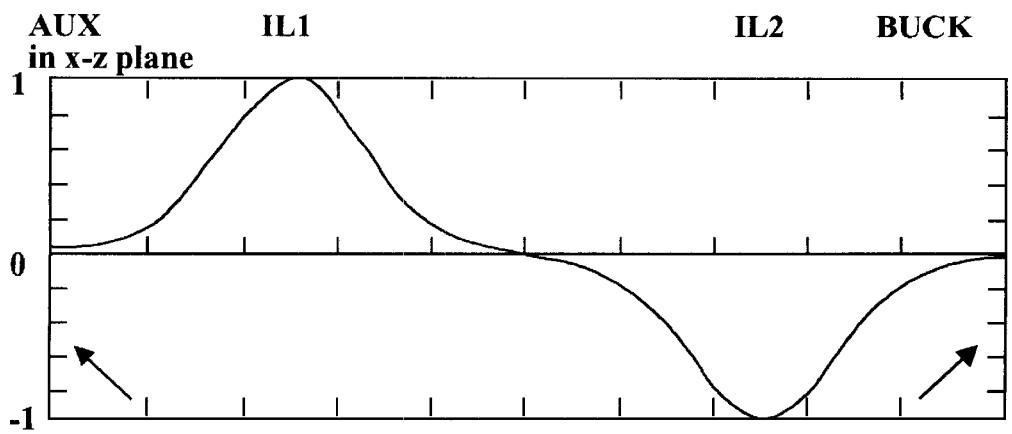
FIGS. 5A–5C shows the on-axis field strength primarily of the main lenses, which varies along the z-direction.
Figure 5B:
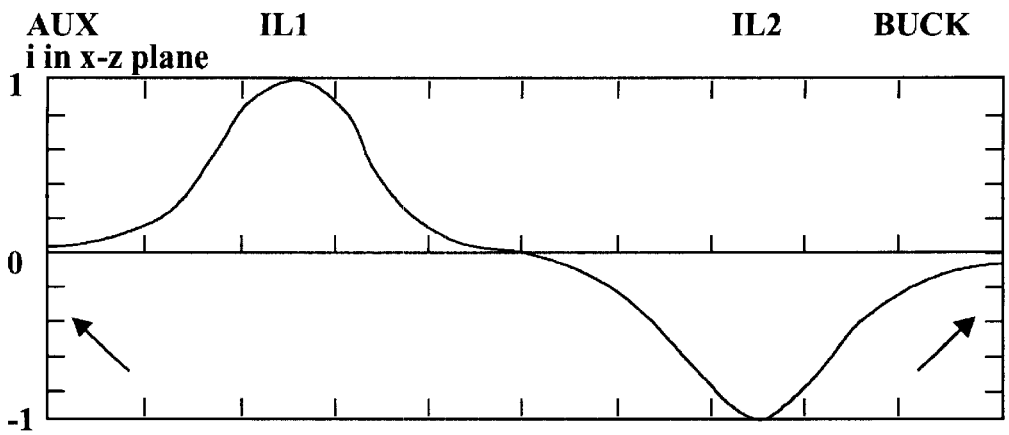
Figure 5C:
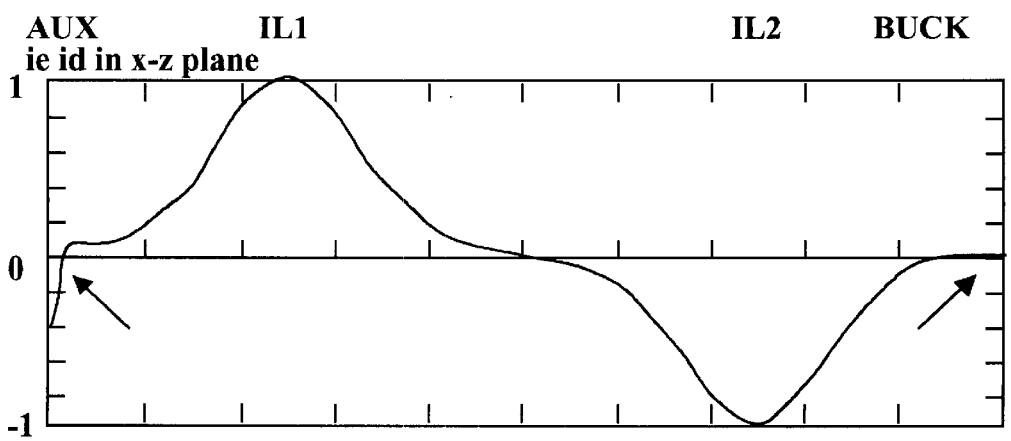

FIGS. 5A–5C show the on-axis field strengths primarily of the main lenses L1 and L2, which vary along the direction a Z-axis ZA. The arrows point at the features of importance in the present context. Referring to FIG. 1, using the example of an illuminator doublet with object ("shaping aperture" SA) to image ("image plane" or target or reticle) magnification of M=−1, the presence of the magnetic material of the additional lenses shown in FIG. 3 cause a more or less detrimental image rotation (FIG. 5A). In other words, in the illustrative case of an illuminator the image plane is not properly illuminated by the image of the shaping aperture SA (they should line up). To correct that, an auxiliary lens AUX located exactly at the object plane in FIG. 1, in combination with lens L1, eliminates this rotation without changing the overall magnification. But the auxiliary lens AUX simultaneously also axially shifts the image of the source upstream of SA (not shown here).

So, if the primary purpose of auxiliary lens AUX is to shift this source image to coincide with, say, the blanking aperture BA (FIG. 1), then the proper combination of auxiliary lens AUX and lens L1 or their relative strength has to be chosen to eliminate any residual image rotation. The latter is demonstrated in FIG. 5B. In this case auxiliary lens AUX and lens L1 need to have the same polarity. Note that the polarity of a magnetic lens, i.e., the direction of the axial field pointing either upstream or downstream, is irrelevant to the image shift, but not for the image rotation.

If one wants to null the field at the target with bucking lens BK, but at the same time maintain unity magnification and zero rotation, then auxiliary lens AUX has also to buck its associated lens L1, as shown in FIG. 5C. The corresponding source image shift then has to be taken into account by the optics upstream, in our example the "condenser section" seen in FIG. 1. Since, as shown, the emphasis on "bucking" with AUX may lead to a substantial distortion of the net field distribution, and possibly to increased aberrations, it may not be desirable to use auxiliary lens AUX for this purpose, but to rotate the object SA mechanically and provide auxiliary lens AUX primarily/solely for source image shifting.

Figure 6:
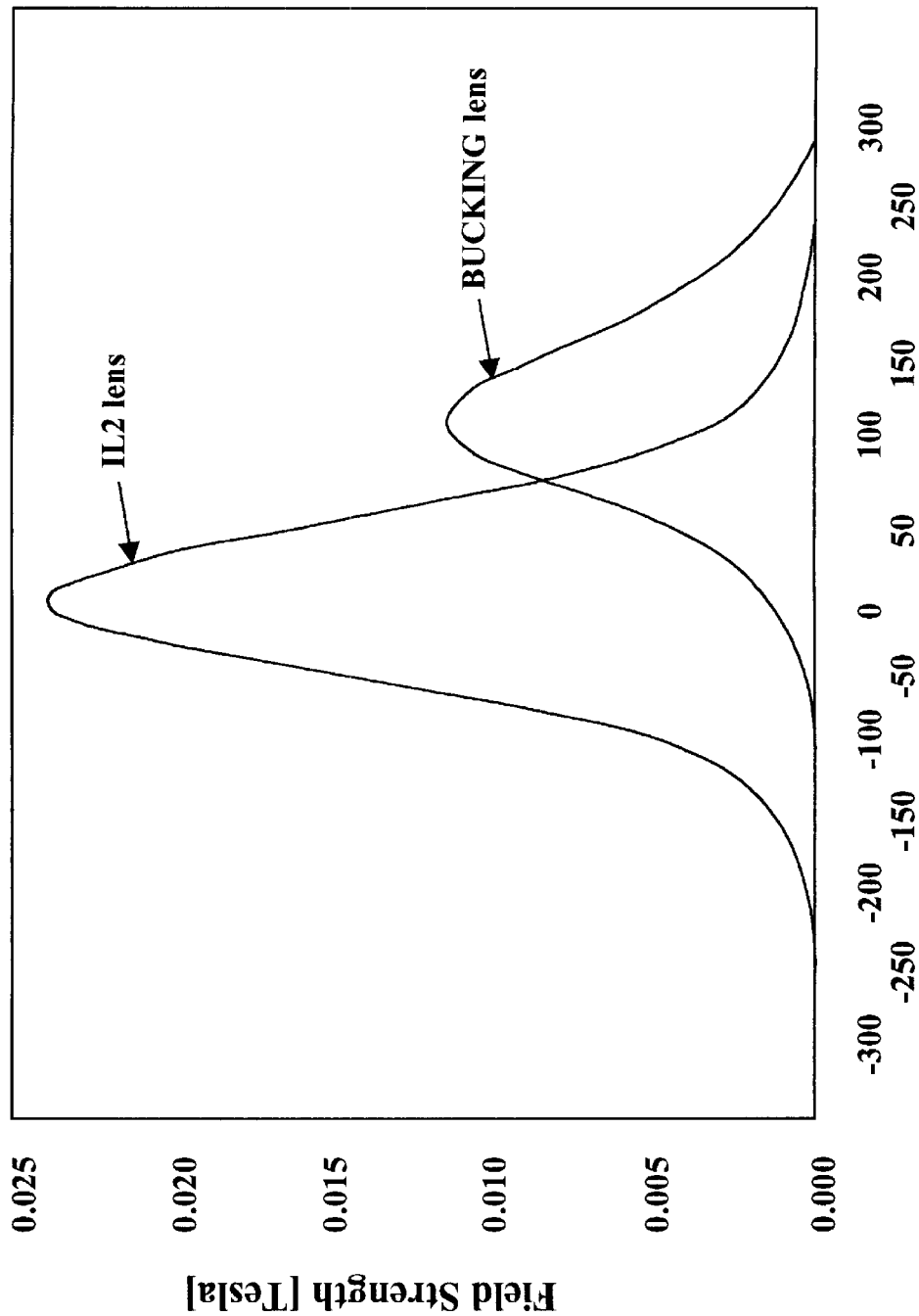
FIG. 6 shows the axial field distributions of the "normal" or "main" lens (L2 in this example) and the bucking lens BK, without regard to the eventually required ratio of amplitude and polarity.

FIG. 6 shows the axial field distributions of the "normal" or "main" lens (L2 in this example) and the bucking lens BK, without regard to the eventually required ratio of amplitude and polarity. As can be seen, the width of both distributions, e.g. measured at half amplitude in each case (the so-called Full Width at Half Maximum or FWHM), is nearly the same. To generate such a field with a "normal" lens for bucking would require a lens of roughly the same physical dimensions as the "normal" lens L2 of FIGS. 1–4, which would hardly be a useful configuration. It would likely obstruct the space required for the target (e.g. reticle) situated on a moving stage at the image plane. The bucking lens BK, however, shown in FIG. 2, 3, and FIG. 4, is substantially less intrusive, but serves the purpose.

Figure 7A:
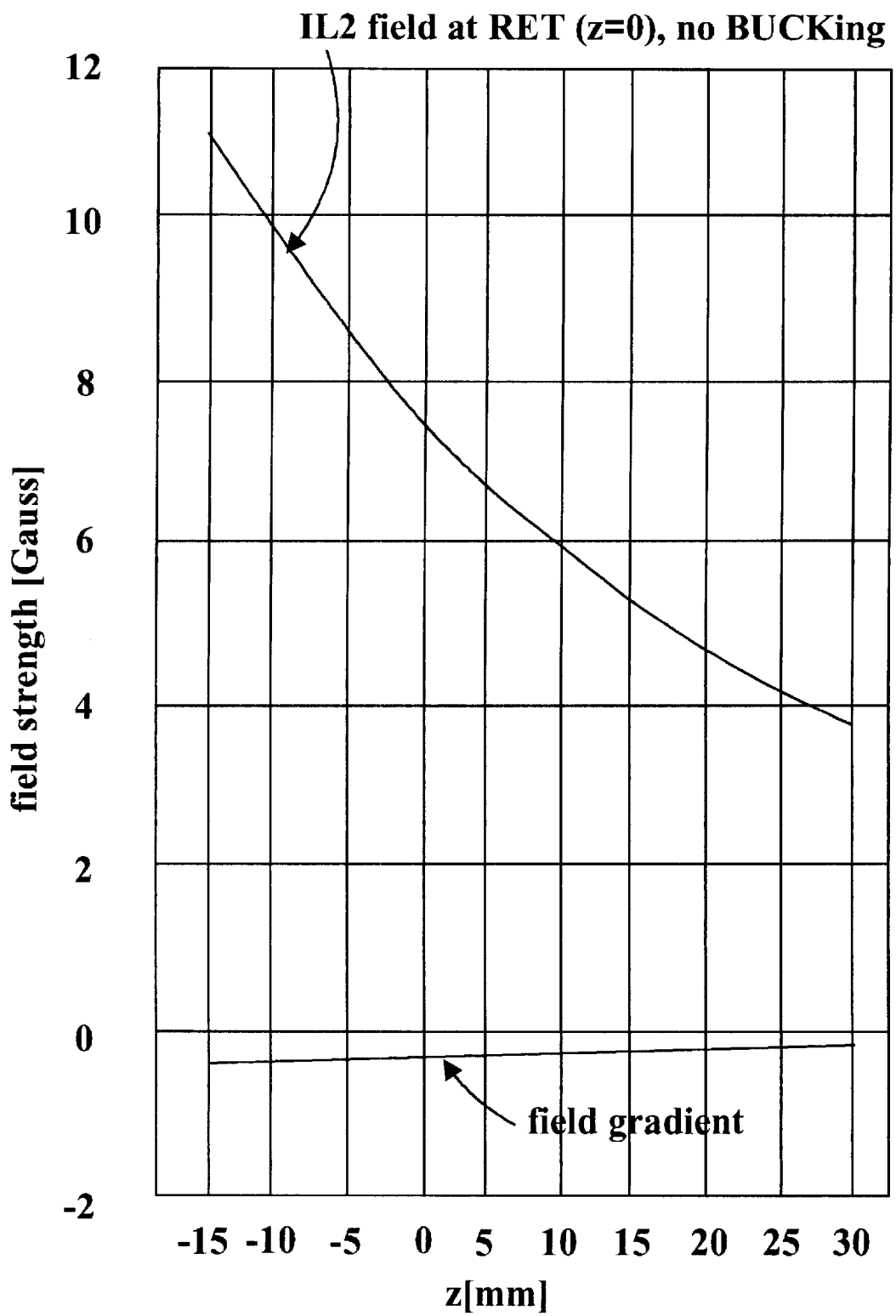
FIG. 7A shows (enlarged) the tail of the field distribution of the lens L2, as well as its first derivative, i.e. slope, crossing the target plane.

FIG. 7A shows (enlarged) the tail of the field distribution of the lens L2 as well as its first derivative, i.e. slope, crossing the target plane. It demonstrates that the strength of the field in the target plane may be small (in the present example about 7.7 Gauss or 3% of the field maximum of about 250 Gauss), but is not negligible.

If the target (reticle) is moving (horizontally) within this "residual" magnetic field, even small amounts of bulk metallic material imbedded in the target stage or reticle may cause eddy currents, generating magnetic fields affecting the beam position at the target in a largely uncontrolled manner. Completely avoiding such imbedded metal most certainly complicates design, construction and cost of the target stage.

Also the fact that the slope or gradient of the field at the target is non-zero implies that even small variations the axial position of the target in the order of tens of micrometers due to stage and/or reticle tolerances will effect a detrimental beam positional shift.

Figure 7B:
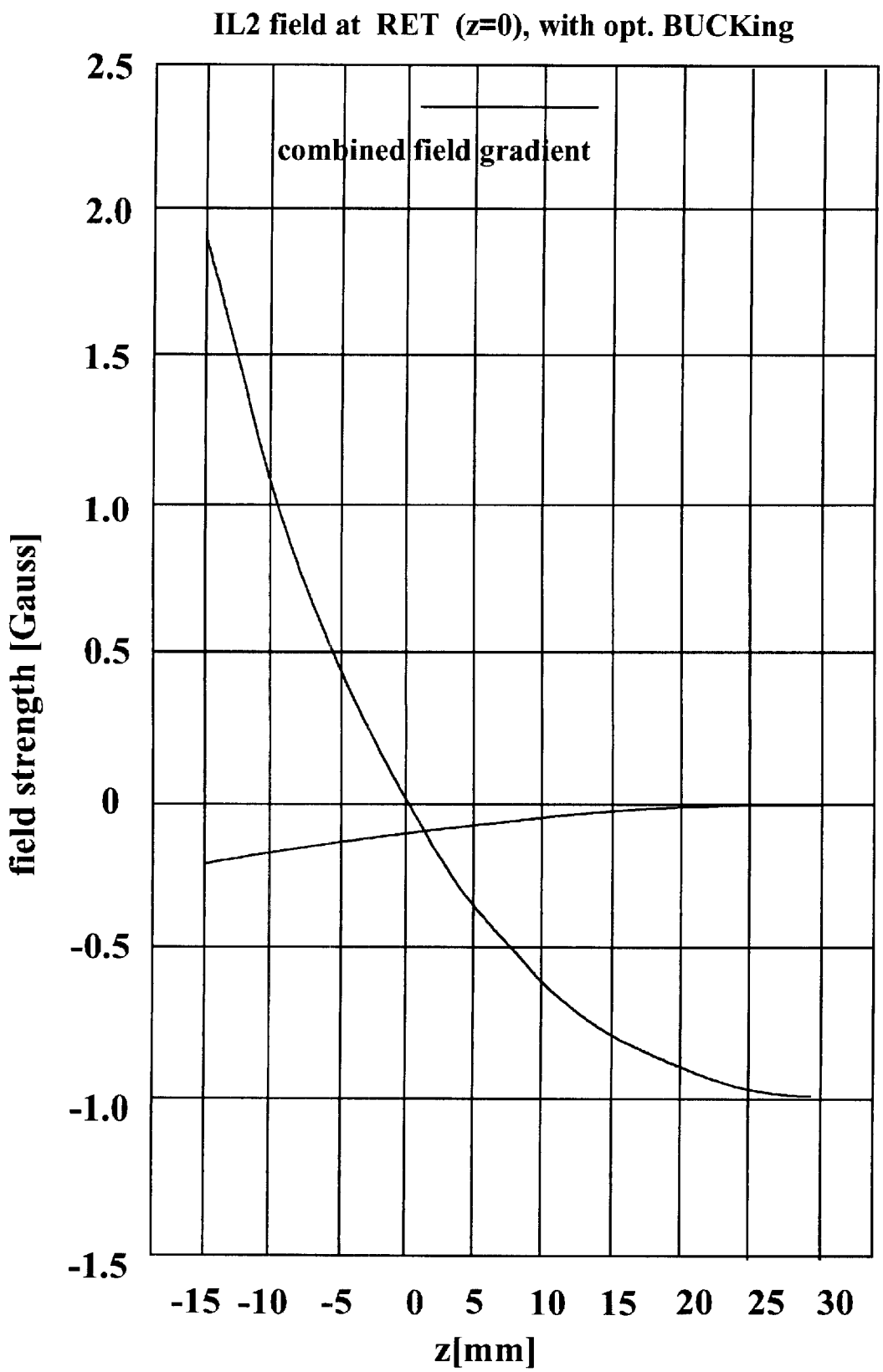
FIG. 7B shows the improvement achieved by the bucking lens.

Comparing FIG. 7A to FIG. 7B shows the improvement achieved by the bucking lens BK as in FIG. 7B (note the change of scale).

FIG. 8 provides numerical data including the results of axially repositioning of bucking lens BK, while its strength (its attenuation of the main field of L2) is adjusted to null the field at the target plane. Besides the overall reduction from the "unbucked" case (at the bottom of the table), proper positioning may further reduce the slope.

The data shown are not to be considered ultimate, but exemplary, and may very well be improved by further lens design refinement.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A charged particle beam system comprising:
   means for providing a source of charged particles and producing a beam of said particles directed along a path having a path direction,
   a given electromagnetic lens (L2) located along said path, said given electromagnetic lens being provided to produce a first field directed with a first orientation along a first field direction across said path direction for affecting a beam of charged particles directed along said path direction through said lens,
   a bucking electromagnetic lens juxtaposed with said given electromagnetic lens for producing a bucking field directed with a bucking orientation for affecting said beam of charged particles directed along said path, said bucking lens providing a field having an orientation extending at right angles to said first field direction, said bucking electromagnetic lens including an excitation coil (CL3) and a bucking shroud formed about said excitation coil (CL3) with a pair of bucking pole pieces including an inner pole piece (P5), an outer pole piece (P6) and shroud plates (FM8–FM10), said bucking shroud confining said bucking field from said excitation coil to project said bucking field from said inner pole piece (P5) parallel to said path direction, then away from said path direction, and then back to said outer pole piece (P6), with the shortest distance between said inner pole and said outer pole being along a direction extending across said path direction,
   whereby a fringe field from said bucking electromagnetic lens produces a nulling field to compensate for aberrations and/or beam disturbances.

2. The system of claim 1 comprising a first shroud formed surrounding said given electromagnetic lens having said pair of pole pieces with the shortest distance between said pole pieces being along a direction parallel to said path direction.

3. The system of claim 1 comprising:
   a first shroud formed surrounding said given electromagnetic lens having a pair of pole pieces with the shortest distance between said pole pieces being along a direction parallel to said path direction, and
   said bucking shroud being located adjacent to said first shroud.

4. The system of claim 1 comprising:
   a further, doublet, electromagnetic lens located along said path, said further electromagnetic lens being provided to produce a further field directed with said first orientation for affecting said beam of charged particles directed along said path through said lens,
   said further electromagnetic lens and said given electromagnetic lens being aligned along said axis with said given electromagnetic lens following said further electromagnetic lens along said path from said source of charged particles.

5. The system of claim 1 comprising an auxiliary lens located along said path direction between said source and said given electromagnetic lens with an aperture located within said auxiliary lens.

6. The system of claim 1 comprising:
   an auxiliary lens located along said path direction between said source and said given electromagnetic lens with an aperture located within said auxiliary lens,
   a further, doublet, electromagnetic lens located along said path direction, said further electromagnetic lens being provided to produce a further field directed with said first orientation for affecting said beam of charged particles directed along said path direction through said lens,
   said further electromagnetic lens being located along said axis between said auxiliary lens and said given electromagnetic lens.

7. The system of claim 6 comprising a first shroud formed surrounding said given electromagnetic lens having a pair of pole pieces with the shortest distance between said pole pieces being along a direction parallel to said path direction.

8. A charged particle beam system comprising:
   means for providing a source of charged particles and producing a beam of said particles directed along a path having a path direction,
   a given electromagnetic lens (L2) located along said path, said given electromagnetic lens (L2) being provided to produce a first field directed with a first orientation along a first field direction across said path direction for affecting a beam of charged particles directed along said path direction through said lens,
   a first shroud formed surrounding said given electromagnetic lens having a pair of pole pieces with the shortest distance between said pole pieces being along a direction parallel to said path direction,
   a bucking electromagnetic lens juxtaposed with said given electromagnetic lens (L2) for producing a bucking field directed with a bucking orientation for affecting said beam of charged particles directed along said path, said bucking lens providing a field having an orientation that is perpendicular to said first field direction, said bucking electromagnetic lens including an excitation coil (CL3) and a bucking shroud formed about said excitation coil (CL3) with a pair of bucking pole pieces including an inner pole piece (P5), an outer pole piece (P6) and shroud plates (FM8–FM10), said buckling shroud confining said bucking field from said excitation coil to project said bucking field from said inner pole piece (P5) parallel to said path direction, then away from said path direction, and then back to said outer pole piece (P6), with the shortest distance between said inner pole and said outer pole being along a direction extending perpendicular to said path direction, and said bucking shroud being located adjacent to said first shroud, whereby a fringe field from said bucking electromagnetic lens produces a nulling field to compensate for aberrations and/or beam disturbances.

9. The system of claim 8 comprising:

a further, doublet, electromagnetic lens located along said path direction, said further electromagnetic lens being provided to produce a further field directed with said first orientation provided for affecting said beam of charged particles directed along said path direction through said lens, said further electromagnetic lens and said given electromagnetic lens being aligned along said axis with said given electromagnetic lens following said further electromagnetic lens along said path direction from said source of charged particles.

10. The system of claim 9 comprising:

said auxiliary lens located at an object plane and said bucking lens being located before a following image plane, said lenses and said electromagnetic coils being toroidal in configuration, and said system comprising an electron beam projection system.

11. The method in accordance with claim 9 comprising:

said auxiliary lens located at an object plane and said bucking lens being located before a following image plane, said lenses and said electromagnetic coils being toroidal in configuration, and said system comprising an electron beam projection system.

12. The system of claim 8 comprising said lenses and said electromagnetic coils being toroidal in configuration.

13. The system of claim 8 comprising:

said auxiliary lens located at an object plane and said bucking lens being located before a following image plane, said lenses and said electromagnetic coils being toroidal in configuration.

14. A method of operating a charge particle beam projection system comprising:

providing a source of charged particles and producing a beam of said particles directed along a path direction, providing a given electromagnetic lens (L2) located along said path direction, said given electromagnetic lens (L2) being provided to produce a first field directed with a first orientation in a first field direction across said path direction for affecting a beam of charged particles directed along said path direction through said lens, providing a bucking electromagnetic lens juxtaposed with said given electromagnetic lens to produce a bucking field directed with a bucking orientation for affecting said beam of charged particles directed along said path direction, said bucking lens providing a field extending at right angles to said first field direction, said bucking electromagnetic lens including an excitation coil (CL3) and a bucking shroud formed about said excitation coil (CL3) with a pair of bucking pole pieces including an inner pole piece (P5), an outer pole piece (P6) and shroud plates (FM8–FM10), said bucking shroud confining said bucking field from said excitation coil to project said bucking field from said inner pole piece (P5) parallel to said path direction, then away from said path direction, and then back to said outer pole piece (P6), with the shortest distance between said inner pole and said outer pole being along a direction extending across said path direction, whereby a fringe field from said bucking electromagnetic lens produces a nulling field to compensate for aberrations and/or beam disturbances.

15. The method of claim 14 comprising providing a first shroud formed surrounding said given electromagnetic lens having a pair of pole pieces with the shortest distance between said pole pieces being along a direction parallel to said path direction.

16. The method of claim 15 comprising:

providing a first shroud formed surrounding said given electromagnetic lens having a pair of pole pieces with the shortest distance between said pole pieces being along a direction parallel to said path direction, and said bucking shroud being located adjacent to said first shroud.

17. The method of claim 15 comprising:

providing a further, doublet, electromagnetic lens located along said path direction, said further electromagnetic lens being provided to produce further field directed with said first orientation for affecting said beam of charged particles directed along said path direction through said lens, said further electromagnetic lens and said given electromagnetic lens being aligned along said axis with said given electromagnetic lens following said further electromagnetic lens along said path direction from said source of charged particles.

18. The method of claim 14 comprising providing an auxiliary lens located along said path direction between said source and said given electromagnetic lens with an aperture located within said auxiliary lens.

19. The method of claim 14 comprising:

providing an auxiliary lens located along said path direction between said source and said given electromagnetic lens with an aperture located within said auxiliary lens, providing a further, doublet, electromagnetic lens located along said path direction, said further electromagnetic lens being provided to produce a further field directed with said first orientation adapted for affecting said beam of charged particles directed along said path direction through said lens, said further electromagnetic lens being located along said axis between said auxiliary lens and said given electromagnetic lens.

20. The method of claim 19 comprising providing a first shroud formed surrounding said given electromagnetic lens having a pair of pole pieces with the shortest distance between said pole pieces being along a direction parallel to said path direction.

21. The method of claim 19 comprising:

providing a first shroud formed surrounding said given electromagnetic lens having a pair of pole pieces with the shortest distance between said pole pieces being along a direction parallel to said path direction, and said bucking shroud being located adjacent to said first shroud.

22. The method of claim 19 comprising:

providing a further, doublet, electromagnetic lens located along said path direction, said further electromagnetic lens provided to produce a further field directed with said first orientation for affecting said beam of charged particles directed along said path direction through said lens, said further electromagnetic lens and said given electromagnetic lens being aligned along said axis with said given electromagnetic lens following said further electromagnetic lens along said path direction from said source of charged particles.

23. The method of claim 19 comprising said lenses and said electromagnetic coils being toroidal in configuration.

24. The method in accordance with claim 19 comprising:

said auxiliary lens located at an object plane and said bucking lens being located before a following image plane, said lenses and said electromagnetic coils being toroidal in configuration.

* * * * *